United States Patent
Echigo (10) Patent No.: US 10,641,932 B2
(45) Date of Patent: May 5, 2020

(54) IMAGING DEVICE

(71) Applicant: OLYMPUS CORPORATION, Hachioji, Tokyo (JP)

(72) Inventor: Hitoshi Echigo, Sagamihara (JP)

(73) Assignee: OLYMPUS CORPORATION, Tokyo (JP)

( * ) Notice: Subject to any disclaimer, the term of this patent is extended or adjusted under 35 U.S.C. 154(b) by 199 days.

(21) Appl. No.: 15/979,001

(22) Filed: May 14, 2018

(65) Prior Publication Data

US 2018/0259685 A1 Sep. 13, 2018

Related U.S. Application Data (63) Continuation of application No. PCT/JP2015/085180, filed on Dec. 16, 2015.

(51) Int. Cl.
*G02B 13/16* (2006.01)
*G02B 5/00* (2006.01)
(Continued)

(52) U.S. Cl.
CPC .............. *G02B 5/005* (2013.01); *G02B 13/16* (2013.01); *G02B 21/00* (2013.01); *H01L 27/14627* (2013.01); *H04N 5/2254* (2013.01); *H04N 5/238* (2013.01); *G02B 21/241* (2013.01); *G02B 21/26* (2013.01); *G02B 26/001* (2013.01)

(58) Field of Classification Search
CPC ...... G02B 5/005; G02B 13/16; G02B 21/241; G02B 21/26; G02B 26/001; G02B 21/00; H04N 5/2254; H04N 5/238; H01L 27/14627

USPC ....... 359/618, 619, 740, 800, 801, 804, 809, 359/810, 814, 821, 823; 355/33, 53; 353/32, 34, 89, 96, 97
See application file for complete search history.

(56) References Cited

U.S. PATENT DOCUMENTS 8,395,840 B2 * 3/2013 Ganser ................ G02B 21/248
359/821
2003/0210385 A1 * 11/2003 Shigematsu ......... G02B 13/146
355/53

(Continued)

FOREIGN PATENT DOCUMENTS

JP 4748257 B2 8/2011
JP 2011203792 A 10/2011

OTHER PUBLICATIONS

International Search Report (ISR) dated Mar. 15, 2016 issued in International Application No. PCT/JP2015/085180.

*Primary Examiner* — Evelyn A Lester
(74) *Attorney, Agent, or Firm* — Holtz, Holtz & Volek PC (57) ABSTRACT

An imaging device includes a stage, an imaging element, a plurality of lenses, a plurality of diaphragms, an adjuster, and a controller. Light passing through each of the plurality of lenses passes through any one of the plurality of diaphragms. The controller is configured to control at least one of a diameter of the opening in each of the plurality of diaphragms and a position of each of the plurality of diaphragms in the optical axis direction of the imaging element so that a size of a valid area of a plurality of images projected on the imaging element by the plurality of lenses is equal to or greater than a first reference value. The valid area is an area on which each of the plurality of images is projected, excluding an area in which two adjacent images overlap.

8 Claims, 4 Drawing Sheets

(51) Int. Cl.
    *H04N 5/238*     (2006.01)
    *G02B 21/00*     (2006.01)
    *H04N 5/225*     (2006.01)
    *H01L 27/146*     (2006.01)
    *G02B 21/24*     (2006.01)
    *G02B 21/26*     (2006.01)
    *G02B 26/00*     (2006.01)

(56) References Cited

U.S. PATENT DOCUMENTS

| | | | |
|---|---|---|---|
| 2009/0185277 A1* | 7/2009 | Koizumi | B41J 2/451 359/619 |
| 2010/0026453 A1 | 2/2010 | Yamamoto et al. | |
| 2011/0233383 A1 | 9/2011 | Oku | |

\* cited by examiner

IMAGING DEVICE

This application is a continuation application based on PCT International Application No. PCT/JP 2015/085180, filed on Dec. 16, 2015, the content of which is incorporated herein by reference.

BACKGROUND OF THE INVENTION

Field of the Invention

The present invention relates to an imaging device.

Description of Related Art

An imaging method using a lens array in which a plurality of microlenses are disposed has been disclosed. A distance (subject distance) between the center of a lens and a subject and a focus distance of the lens are proportional to the diameter of the lens. Therefore, by using a microlens having a small diameter instead of a lens having a large diameter, the subject distance and the focus distance become short. Thus, reducing thickness of an optical system is possible.

However, crosstalk or a gap may occur between two images projected by adjacent lenses, according to a spread angle (maximum incident angle) of light incident on a microlens. The crosstalk means a portion in which the two images overlap. The gap means an opening between the two images. In the crosstalk, since information on each of the two overlapping images is not individually obtained, information on the subject is lost. Since the gap is dark, the information on the subject is not obtained from the gap.

By controlling the spread angle of light passing through the lens, the crosstalk and the gap are resolved. For example, in the technology disclosed in Japanese Unexamined Patent Application. First Publication No. 2011-203792, a diaphragm array is disposed between two lens arrays that light having a sufficient spread angle enters. A plurality of microlenses are disposed on the surface of each of the two lens arrays. The diaphragm array suppresses the crosstalk between the two adjacent images by blocking a component of the light having a large spread angle.

SUMMARY OF THE INVENTION

According to a first aspect of the present invention, an imaging device includes a stage, an imaging element, a plurality of lenses, a plurality of diaphragms, an adjuster, and a controller. The stage is configured to hold a sample which is a subject. The imaging element is configured to image the sample. The plurality of lenses are disposed between the stage and the imaging element and are configured to project an image of the sample on the imaging element. The plurality of diaphragms are disposed between the plurality of lenses and the imaging element and have openings. The adjuster is configured to adjust a position of the stage in an optical axis direction of the imaging element, and adjust a position of at least one of the imaging element and the plurality of lenses in the optical axis direction of the imaging element. Light passing through each of the plurality of lenses passes through any one of the plurality of diaphragms. The controller is configured to control at least one of a diameter of the opening in each of the plurality of diaphragms and a position of each of the plurality of diaphragms in the optical axis direction of the imaging element so that a size of a valid area of a plurality of images projected on the imaging element by the plurality of lenses is equal to or greater than a first reference value. The valid area is an area on which each of the plurality of images is projected, excluding an area in which two adjacent images overlap. The first reference value is the size of the valid area when the two adjacent images border each other.

According to a second aspect of the present invention, in the first aspect, the controller may configured to control at least one of the diameter of the opening in each of the plurality of diaphragms and the position of each of the plurality of diaphragms in the optical axis direction of the imaging element so that the size of the valid area of the plurality of images is equal to the first reference value.

According to a third aspect of the present invention, in the first aspect, the plurality of lenses may be disposed so that two adjacent lenses included in the plurality of lenses border each other. The controller may configured to control at least one of the diameter of the opening in each of the plurality of diaphragms and the position of each of the plurality of diaphragms in the optical axis direction of the imaging element so that a size of the plurality of images is the same as a size of the plurality of lenses.

According to a fourth aspect of the present invention, in the first aspect, the controller may configured to control at least one of the diameter of the opening in each of the plurality of diaphragms and the position of each of the plurality of diaphragms in the optical axis direction of the imaging element so that the size of the valid area of the plurality of images is equal to or greater than the first reference value and is equal to or less than a second reference value. The second reference value is a maximum value of the size of the valid area.

According to a fifth aspect of the present invention, in the first aspect, the controller may configured to control the diameter of the opening in each of the plurality of diaphragms so that the openings in all of the plurality of diaphragms close. After the openings in all of the plurality of diaphragms close, the controller may configured to control the diameter of the opening in each of the plurality of diaphragms so that the openings in all of the plurality of diaphragms gradually open until the two adjacent images border each other.

According to a sixth aspect of the present invention, in the first aspect, the controller may configured to control the diameter of the opening in each of the plurality of diaphragms so that the two adjacent images overlap. After the two adjacent images overlap, the controller may configured to control the diameter of the opening in each of the plurality of diaphragms so that the openings in all of the plurality of diaphragms gradually close until the two adjacent images border each other.

According to a seventh aspect of the present invention, in the first aspect, the controller may configured to calculate the size of the valid area on the basis of the positions of the plurality of lenses, the plurality of diaphragms, and the imaging element in the optical axis direction of the imaging element. The controller may configured to control at least one of the diameter of the opening in each of the plurality of diaphragms and the position of each of the plurality of diaphragms in the optical axis direction of the imaging element on the basis of the calculated size of the valid area.

According to an eighth aspect of the present invention, in the first aspect, in a case in which the position of at least one of the plurality of lenses, the plurality of diaphragms, and the imaging element in the optical axis direction of the imaging element changes after the size of the valid area reaches a predetermined size, the controller may configured to control at least one of the diameter of the opening in each of the plurality of diaphragms and the position of each of the plurality of diaphragms in the optical axis direction of the imaging element so that the size of the valid area is fixed to the predetermined size. The predetermined size is equal to or greater than the first reference value.

DETAILED DESCRIPTION OF THE INVENTION

Figure 1:
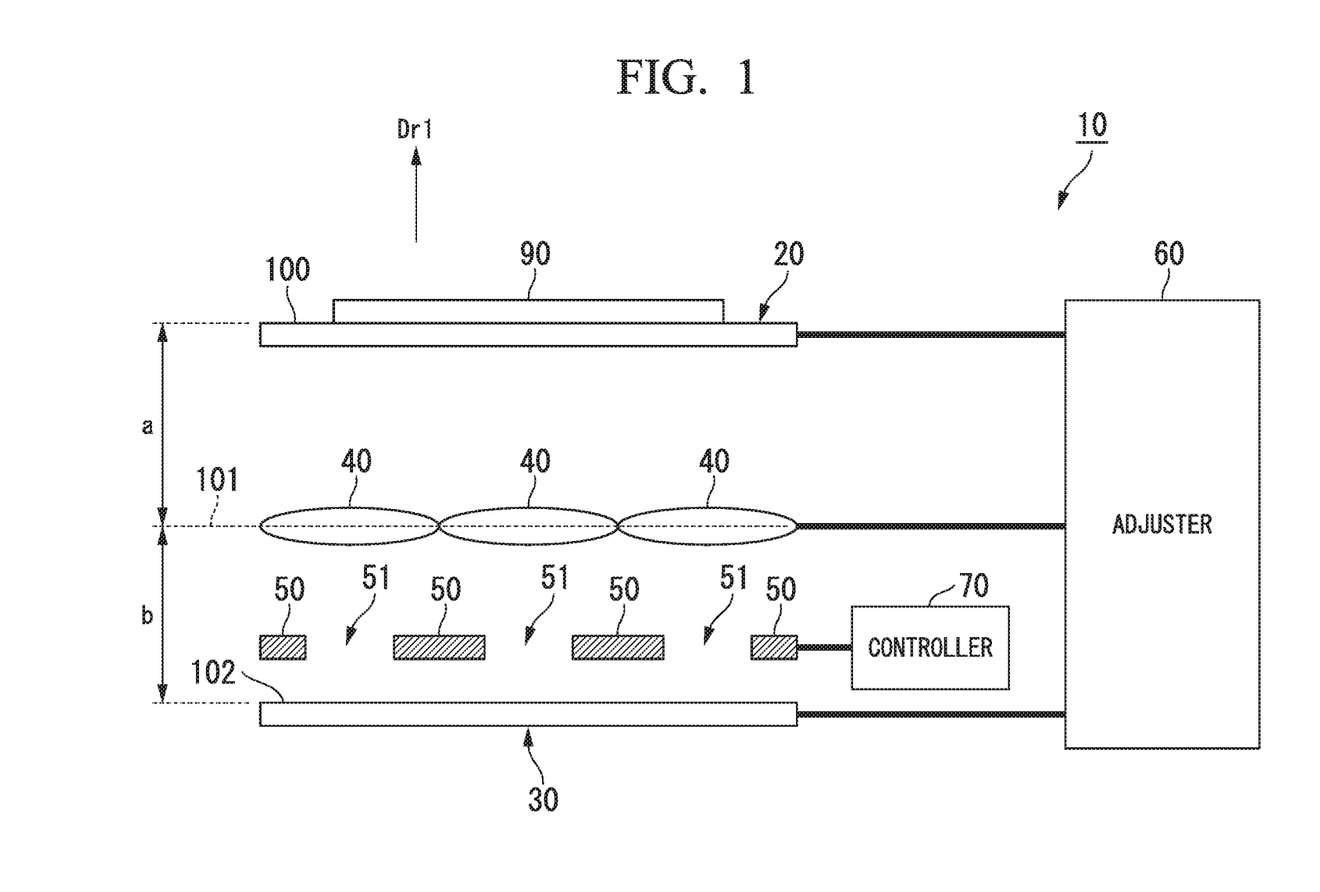
FIG. 1 is a block diagram showing a constitution of an imaging device according to an embodiment of the present invention.

An embodiment of the present invention will be described with reference to the drawings. FIG. 1 shows a constitution of an imaging device 10 according to the embodiment of the present invention. As shown in FIG. 1, the imaging device 10 includes a stage 20, an imaging element 30, a plurality of lenses 40, a plurality of diaphragms 50, an adjuster 60, and a controller 70. Each constitution shown in FIG. 1 is hardware. FIG. 1 shows a cross section through the stage 20, the imaging element 30, the plurality of lenses 40, and the plurality of diaphragms 50. The cross section is perpendicular to a surface 100 included in the stage 20.

The stage 20 holds a sample 90 which is a subject. The imaging element 30 images the sample 90. The plurality of lenses 40 are disposed between the stage 20 and the imaging element 30, and project an image of the sample 90 on the imaging element 30. The plurality of diaphragms 50 are disposed between the plurality of lenses 40 and the imaging element 30, and have openings 51. The adjuster 60 adjusts the position of the stage 20 in an optical axis direction Dr1 of the imaging element 30, and adjusts the position of at least one of the imaging element 30 and the plurality of lenses 40 in the optical axis direction Dr1 of the imaging element 30. Light passing through each of the plurality of lenses 40 passes through any one of the plurality of diaphragms 50. The controller 70 controls at least one of a diameter of the opening 51 in each of the plurality of diaphragms 50 and a position of each of the plurality of diaphragms 50 in the optical axis direction Dr1 of the imaging element 30 so that the size of a valid area of a plurality of images projected on the imaging element 30 by the plurality of lenses 40 is equal to or greater than a first reference value. The valid area is an area on which each of the plurality of images is projected, excluding an area in which two adjacent images overlap. The first reference value is the size of the valid area when the two adjacent images border each other.

The details of the constitution shown in FIG. 1 will be described. The stage 20 includes the surface 100 on which the sample 90 is disposed. Light from the sample 90 penetrates the surface 100. The stage 20 is constituted in a plate shape. For example, the stage 20 is constituted with a material through which light penetrates, such as a glass or polycarbonate. The stage 20 may be constituted to be able to hold a side surface of the sample 90. The stage 20 may be constituted with an opaque material, and may have an opening formed in a portion in which the sample 90 is disposed.

The plurality of lenses 40 are microlenses. The plurality of lenses 40 are disposed in two-dimensional space, and concentrates the light penetrating the stage 20. The plurality of lenses 40 may be disposed to be a close packing structure. For example, the center (principal point) of two or more lenses 40 is disposed on a plane 101. That is, the plane 101 is a plane passing through the center of the two or more lenses 40. The plane 101 is parallel to a two-dimensional direction in which the plurality of lenses 40 are disposed. For example, the plane 101 is parallel to the surface 100. In FIG. 1, a cross section of the plane 101 is shown as a broken line.

In FIG. 1, each of the plurality of lenses 40 is independently formed. The plurality of lenses 40 may be formed in an array form with respect to one base body. In this case, the base body and the plurality of lenses 40 are integrated. For example, the shape of the lens 40 is a circle. The shape of the lens 40 may be a polygon such as a triangle, a quadrangle, or a hexagon.

The plurality of lenses 40 project the image of the sample 90 based on the light penetrating the stage 20 on the imaging element 30. For example, the image (image circle) of the sample 90 which is projected by each of the plurality of lenses 40 is a circular shape. The image of the sample 90 which is projected by each of the plurality of lenses 40 may be a polygonal shape.

Each of the plurality of diaphragms 50 corresponds to any one of the plurality of lenses 40. The diameters of the openings 51 of the plurality of diaphragms 50 are changeable. For example, the plurality of diaphragms 50 are mechanical diaphragms such as iris diaphragms. The plurality of diaphragms 50 may be electrical diaphragms such as liquid crystal. In a case in which the plurality of diaphragms 50 are disposed in the vicinity of the focus position of the plurality of lenses 40, the plurality of diaphragms 50 is able to extensively control the spread angle of the light.

For example, the imaging element 30 is an image sensor on which a complementary metal oxide semiconductor (CMOS) or a charge-coupled device (CCD) is mounted. The light passing through the plurality of lenses 40 and the plurality of diaphragms 50 enters the imaging element 30. The imaging element 30 outputs an image signal based on the light. The imaging element 30 includes a surface 102 (imaging surface) on which a plurality of pixels which the light passing through the plurality of lenses 40 and the plurality of diaphragms 50 enters are disposed. For example, the surface 102 is parallel to the surface 100. Each of the plurality of pixels outputs the image signal based on the light incident on each of the plurality of pixels.

The adjuster 60 is constituted with one or more processors. The processor includes a central processing unit (CPU), an application specific integrated circuit (ASIC), or the like. The adjuster 60 may include a drive circuit which drives the stage 20, the imaging element 30, and the plurality of lenses 40 in the optical axis direction Dr1 of the imaging element 30. The adjuster 60 adjusts the positions of the stage 20, the imaging element 30 and the plurality of lenses 40 in the optical axis direction Dr1 of the imaging element 30 so that the image of the sample 90 is projected on the surface 102 of the imaging element 30. The adjuster 60 may adjust the position of only the imaging element 30 among the imaging element 30 and the plurality of lenses 40. The adjuster 60 may adjust the position of only the plurality of lenses 40 among the imaging element 30 and the plurality of lenses 40.

The controller 70 is constituted with one or more processors. The controller 70 may include an image processing circuit which processes the image signal. Alternatively, the imaging device 10 may include an image processing circuit which is independent from the controller 70. The controller 70 detects the size of a valid area of the image projected on the imaging element 30 by the plurality of lenses 40 on the basis of the image signal output from the imaging element 30. Alternatively, the controller 70 detects the size of the valid area of the image projected on the imaging element 30 by the plurality of lenses 40 on the basis of the positions of the stage 20, the imaging element 30, and the plurality of lenses 40 in the optical axis direction Dr1 of the imaging element 30. The controller 70 may control only the diameters of the openings 51 of the plurality of diaphragms 50 among the diameters of the openings 51 of the plurality of diaphragms 50 and the positions of the plurality of diaphragms 50 in the optical axis direction Dr1 of the imaging element 30. Alternatively, the controller 70 may control only the positions of the plurality of diaphragms 50 in the optical axis direction Dr1 of the imaging element 30 among the diameters of the openings 51 of the plurality of diaphragms 50 and the positions of the plurality of diaphragms 50 in the optical axis direction Dr1 of the imaging element 30. The controller 70 controls the positions of the plurality of diaphragms 50 in the optical axis direction Dr1 of the imaging element 30, through the adjuster 60.

The adjustment of the positions of the stage 20, the imaging element 30, and the plurality of lenses 40 by the adjuster 60 will be described. The adjuster 60 realizes an arbitrary image formation magnification by adjusting the position of such elements in the optical axis direction Dr1 of the imaging element 30. In a case in which the distance between the sample 90 and the plurality of lenses 40 is defined as a, the distance between the plurality of lenses 40 and the imaging element 30 is defined as b, the focus distance of the plurality of lenses 40 is defined as f, and the image formation magnification is defined as β, Expression (1) and Expression (2) are established. In general, the focus distance f of the plurality of lenses 40 is a fixed value.

[Math. 1]

$$\beta = \frac{b}{a} \quad (1)$$

$$\frac{1}{a} + \frac{1}{b} = \frac{1}{f} \quad (2)$$

In a case in which the image formation magnification β is set, the adjuster 60 calculates the distance a and the distance b corresponding to the arbitrary image formation magnification β on the basis of Expression (1) and Expression (2). The adjuster 60 adjusts the position of the stage 20 in the optical axis direction Dr1 of the imaging element 30 so that the distance between the sample 90 and the plurality of lenses 40 is the distance a. The adjuster 60, if necessary, adjusts the positions of the plurality of lenses 40 in the optical axis direction Dr1 of the imaging element 30. The adjuster 60 adjusts a position of at least one of the imaging element 30 and the plurality of lenses 40 in the optical axis direction Dr1 of the imaging element 30 so that the distance between the plurality of lenses 40 and the imaging element 30 is the distance b.

Figure 2:
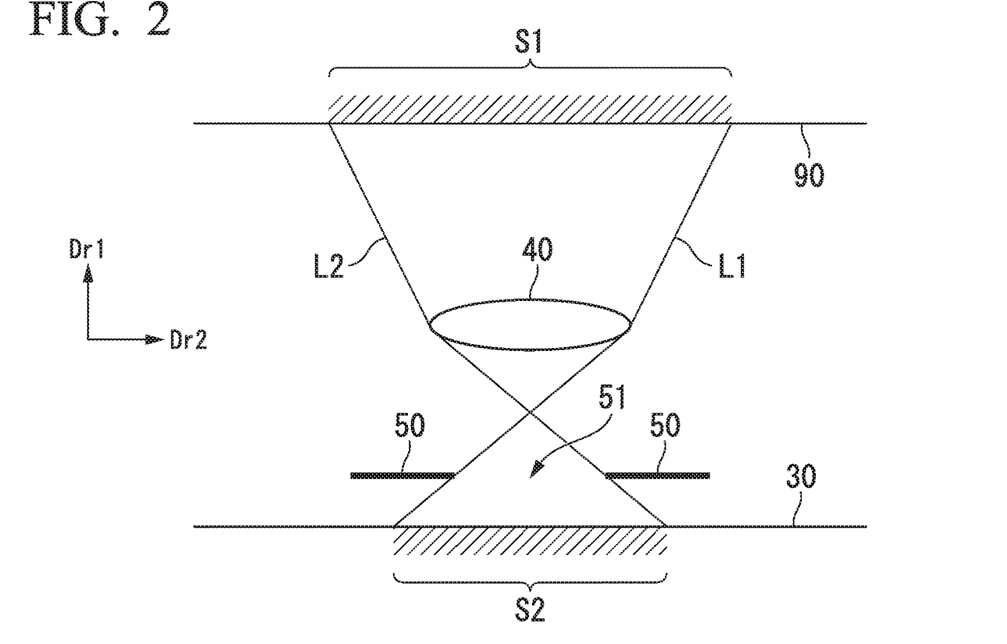
FIG. 2 is a schematic diagram showing an area of a sample and an area of an imaging element on which an image of the area of the sample is projected in the embodiment of the present invention.

The image projected on the imaging element 30 will be described. FIG. 2 shows an area S1 of the sample 90, and an area S2 of the imaging element 30 on which an image of the area S1 is projected. FIG. 2 shows a cross section through the imaging element 30, the lens 40, the diaphragm 50, and the sample 90.

Light L1 and light L2 passing through an end portion of the area S1 among light projected on the imaging element 30 by the lens 40 pass through an end portion of the lens 40 and an end portion of the diaphragm 50. The light L1 and the light L2 enter the area S2 of the imaging element 30. The size of the image projected on the imaging element 30 by the lens 40 is the same as that of the area S2. The size of the area S2 is based on the positions of the stage 20, the imaging element 30, and the plurality of lenses 40 in the optical axis direction Dr1 of the imaging element 30. In addition, the size of the area S2 is based on the position of the end portion of the lens 40 and the position of the end portion of the diaphragm 50 in a direction Dr2 perpendicular to the optical axis direction Dr1 of the imaging element 30.

Figure 3:
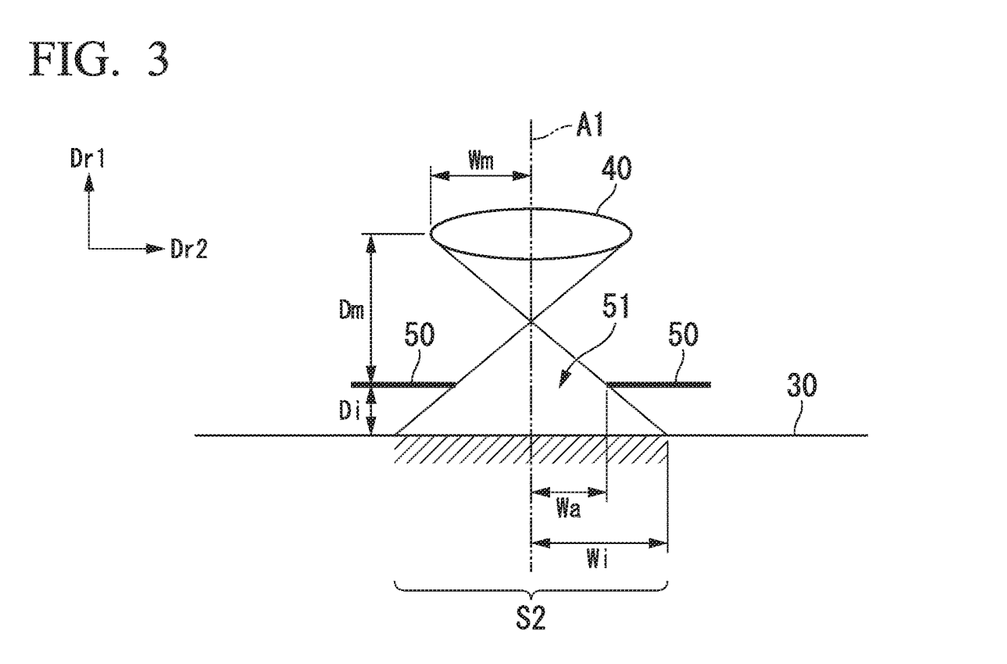
FIG. 3 is a schematic diagram showing the positions of the imaging element, a lens, and a diaphragm in the embodiment of the present invention.

FIG. 3 shows the positions of the imaging element 30, the lens 40, and the diaphragm 50. FIG. 3 shows a cross section through the imaging element 30, the lens 40, and the diaphragm 50. In a case in which the distance between an optical axis A1 and the end portion of the lens 40 is defined as Wm, the distance between the optical axis A1 and the end portion of the diaphragm 50 is defined as Wa, the distance between the optical axis A1 and the end portion of the area S2 of the imaging element 30 is defined as Wi, the distance between the lens 40 and the diaphragm 50 is defined as Dm, and the distance between the diaphragm 50 and the imaging element 30 is defined as Di, Expression (3) is established. The optical axis A1 passes through the center of the lens 40. The distance Wa is the radius of the opening 51 of the diaphragm 50.

[Math. 2]

$$Wi = \frac{Di}{Dm}(Wm + Wa) - Wa \quad (3)$$

The controller 70 is able to calculate the distance Wi on the basis of Expression (3). The distance Wi indicates the size of the area S2. That is, the controller 70 is able to calculate the size of the image projected on the imaging element 30 by the lens 40 on the basis of Expression (3).

The controller 70 may calculate the size of the area S2 on the basis of the image signal output from the imaging element 30. For example, the controller 70 may detect the area S2 by detecting an area in which the luminance of the image signal is equal to or greater than a predetermined value, and may calculate the size of the area S2 on the basis of the number of pixels of the detected area S2.

The distance Wa changes by a change of the position of the end portion of the diaphragm 50 in the direction Dr2 perpendicular to the optical axis direction Dr1 of the imaging element 30. In a case in which the distance Wa changes, the distance Wi changes as indicated by Expression (3). That is, the size of the area S2 of the imaging element 30 changes by a change of the diameter of the opening 51 of the diaphragm 50. The controller 70 is able to control the size of the image formed on the imaging element 30 by the lens 40 by controlling the diameter of the opening 51 of the diaphragm 50.

The distance Dm and the distance Di change by a change of the position of the diaphragm 50 in the optical axis direction Dr1 of the imaging element 30. In a case in which the distance Dm and the distance Di change, the distance Wi changes as indicated by Expression (3). That is, the size of the area S2 of the imaging element 30 changes by the change of the position of the diaphragm 50 in the optical axis direction Dr1 of the imaging element 30. The controller 70 is able to control the size of the image formed on the imaging element 30 by the lens 40 by controlling the position of the diaphragm 50 in the optical axis direction Dr1 of the imaging element 30.

Figure 4:
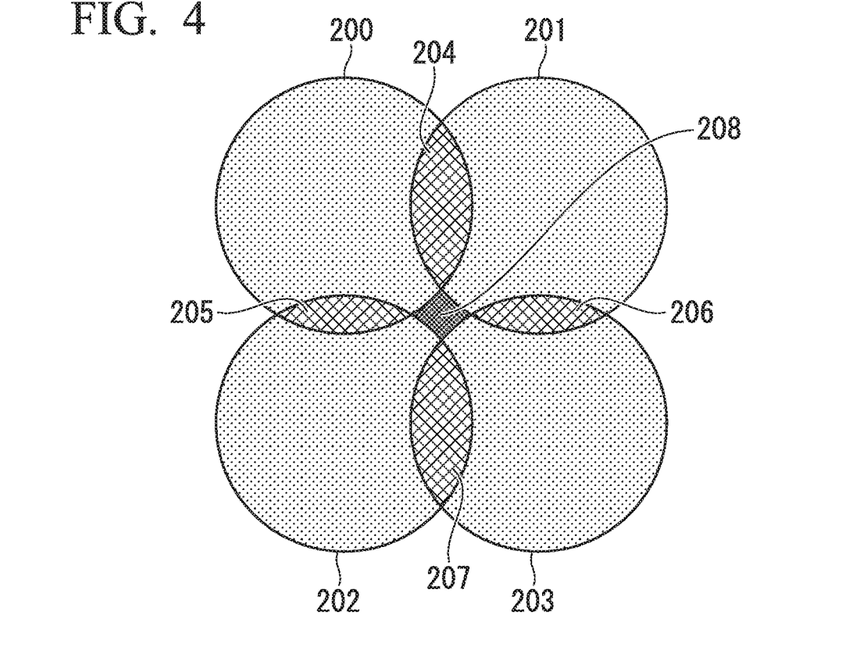
FIG. 4 is a reference diagram showing a plurality of images projected on the imaging element of the embodiment of the present invention.

The valid area will be described. FIG. 4 shows the plurality of images projected on the imaging element 30. FIG. 4 shows an image 200, an image 201, an image 202, and an image 203, which are projected by four lenses 40. Crosstalk occurs in two images formed by two adjacent lenses 40. The crosstalk is an area in which two adjacent images overlap. In FIG. 4, crosstalk 204, crosstalk 205, crosstalk 206, and crosstalk 207 are shown. In FIG. 4, each crosstalk occurs in two images which are adjacent to each other in a row direction or a column direction in the arrangement of the plurality of lenses 40. The crosstalk 204 is an area in which the image 200 and the image 201 overlap. The crosstalk 205 is an area in which the image 200 and the image 202 overlap. The crosstalk 206 is an area in which the image 201 and the image 203 overlap. The crosstalk 207 is an area in which the image 202 and the image 203 overlap.

A gap occurs between the two images formed by the two adjacent lenses 40. The gap is an opening between two adjacent images. In FIG. 4, a gap 208 between the image 200 and the image 203 and between the image 201 and the image 202 is shown. In FIG. 4, the gap 208 occurs between two images which are adjacent to each other in a direction different from the row direction and the column direction in the arrangement of the plurality of lenses 40.

In each crosstalk shown in FIG. 4, each piece of information on the two images which overlap each other is not individually obtained. Therefore, information on the sample 90 is lost from a pixel signal of a pixel corresponding to each crosstalk. The gap 208 shown in FIG. 4 is dark. Therefore, the information on the sample 90 is not obtained from the pixel signal of the pixel corresponding to the gap 208. In order to effectively use a pixel of the imaging element 30, the controller 70 controls at least one of the diameter of the opening 51 of the diaphragm 50 and the position of the diaphragm 50 in the optical axis direction Dr1 of the imaging element 30 so that the valid area increases. The valid area is an area in which each of the plurality of images is projected, excluding an area in which the two adjacent images overlap. In FIG. 4, an area on which the image 200 is projected, excluding the crosstalk 204 and the crosstalk 205, is a valid area of the image 200. An area on which the image 201 is projected, excluding the crosstalk 204 and the crosstalk 206, is a valid area of the image 201. An area on which the image 202 is projected, excluding the crosstalk 205 and the crosstalk 207, is a valid area of the image 202. An area on which the image 203 is projected, excluding the crosstalk 206 and the crosstalk 207, is a valid area of the image 203. By increasing the size of the valid area, the crosstalk and the gap are reduced.

The center of the image projected on the imaging element 30 corresponds to the center of the lens 40. The controller 70 is able to calculate the size of the image projected on the imaging element 30 on the basis of Expression (3). The controller 70 is able to calculate the positions and the sizes of the crosstalk and the gap on the basis of the center position and the size of the image projected on the imaging element 30. Therefore, the controller 70 is able to calculate the size of the valid area.

As described above, the controller 70 calculates the size of the valid area on the basis of the positions of the plurality of lenses 40, the plurality of diaphragms 50, and the imaging element 30 in the optical axis direction Dr1 of the imaging element 30. The controller 70 controls at least one of the diameter of the opening 51 in each of the plurality of diaphragms 50 and the position of each of the plurality of diaphragms 50 in the optical axis direction Dr1 of the imaging element 30 on the basis of the calculated size of the valid area.

The controller 70 is able to detect the center position and the size of the image projected on the imaging element 30 on the basis of the luminance of the image signal. In an image captured by the imaging element 30, the luminance of the crosstalk is high, and the luminance of the gap is low. Therefore, the controller 70 is able to detect the positions and the sizes of the crosstalk and the gap on the basis of the luminance of image signal. That is, the controller 70 is able to calculate the size of the valid area on the basis of the luminance of the image signal.

In a case in which the controller 70 individually controls the diameter of the opening 51 in each of the plurality of diaphragms 50, the diameters and the curvatures of each of the plurality of lenses 40 may not be the same. In a case in which the diameters and the curvatures of each of the plurality of lenses 40 are the same, the controller 70 may control the positions of the plurality of diaphragms 50 in the optical axis direction Dr1 of the imaging element 30.

In a case in which the controller 70 controls the positions of the plurality of diaphragms 50 in the optical axis direction Dr1 of the imaging element 30, the controller 70 may not control the diameters of the plurality of diaphragms 50. That is, a drive unit for changing the diameters of the plurality of diaphragms 50 may not be required. By reducing the drive unit of the plurality of diaphragms 50, the risk of the drive unit of the plurality of diaphragms 50 going out of order is reduced.

(First Operation)

The first operation by the controller 70 is described. In the first operation, the controller 70 controls at least one of the diameter of the opening 51 in each of the plurality of diaphragms 50 and the position of each of the plurality of diaphragms 50 in the optical axis direction Dr1 of the imaging element 30 so that the size of the valid area of the plurality of images formed on the imaging element 30 by the plurality of lenses 40 is equal to the first reference value.

Figure 5:
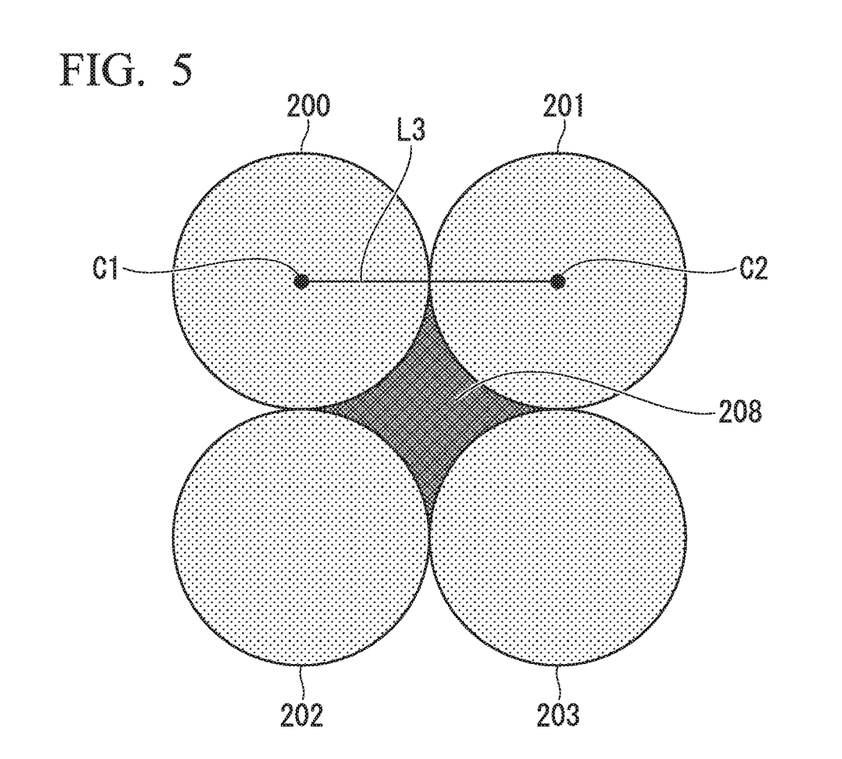
FIG. 5 is a reference diagram showing a plurality of images projected on the imaging element of the embodiment of the present invention.
Figure 6:
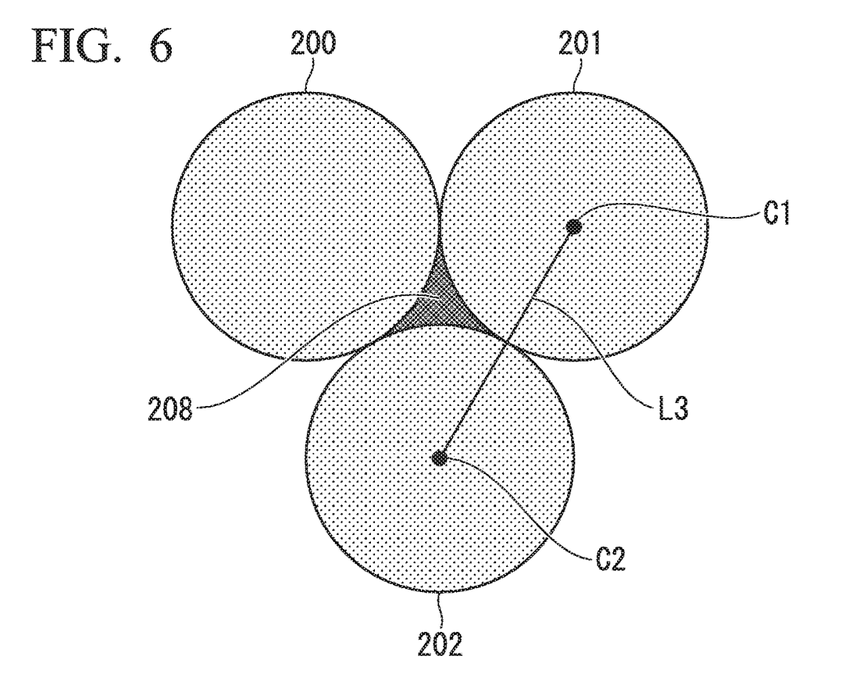
FIG. 6 is a reference diagram showing a plurality of images projected on the imaging element of the embodiment of the present invention.

FIG. 5 and FIG. 6 show the plurality of images projected on the imaging element 30. FIG. 5 shows the image 200, the image 201, the image 202, and the image 203, which are projected by four lenses 40. FIG. 5 shows a state in which the size of a valid area of two adjacent images is equal to the first reference value. The image 200 and the image 201 border each other. Therefore, crosstalk does not occur between the image 200 and the image 201. The image 200 and the image 202 border each other. Therefore, crosstalk does not occur between the image 200 and the image 202.

The image 201 and the image 203 border each other. Therefore, crosstalk does not occur between the image 201 and the image 203. The image 202 and the image 203 border each other. Therefore, crosstalk does not occur between the image 202 and the image 203.

FIG. 6 show, the image 200, the image 201, and the image 202, which are projected by three lenses 40. In FIG. 5 and FIG. 6, the arrangements of the lenses 40 are different from each other. FIG. 6 shows a state in which the size of the valid area of two adjacent images is equal to the first reference value. The image 200 and the image 201 border each other. Therefore, crosstalk does not occur between the image 200 and the image 201. The image 200 and the image 202 border each other. Therefore, crosstalk does not occur between the image 200 and the image 202. The image 201 and the image 202 border each other. Therefore, crosstalk does not occur between the image 201 and the image 202.

In the first operation, the controller 70 performs the above described control so that no two adjacent images overlap, that is, so that crosstalk does not occur between any two adjacent images. When the images border one another, the gap 208 is reduced in comparison with the gap 208 when the images do not border one another. The controller 70 performs the above described control so that the size of the valid area of the entire image is equal to the first reference value. In a case in which the sizes of the lenses 40 are not uniform, the first reference value of the valid area of the images corresponding to each of the lenses 40 may be set according to the size of the lens 40.

A specific example in which the diameters of the openings 51 of the plurality of diaphragms 50 are controlled in the first operation will be described. In a first example of the first operation, the controller 70 controls the diameter of the opening 51 in each of the plurality of diaphragms 50 so that the openings 51 in all of the plurality of diaphragms 50 close. After the openings 51 in all of the plurality of diaphragms 50 close, the controller 70 controls the diameter of the opening 51 in each of the plurality of diaphragms 50 so that the openings 51 in all of the plurality of diaphragms 50 gradually open until two adjacent images among the plurality of images border each other.

In the first example of the first operation, after the openings 51 in all of the plurality of diaphragms 50 close, the controller 70 gradually opens the openings 51 of the plurality of diaphragms 50. Therefore, the plurality of images gradually become larger, and the gap gradually becomes smaller. As shown in FIG. 5 and FIG. 6, the controller 70 opens the openings 51 of the plurality of diaphragms 50 until the gap disappears on a straight line L3 passing through the center C1 and the center C2 of the two adjacent images. When the two adjacent images among the plurality of images border each other, the controller 70 fixes the diameter of the opening 51 in each of the plurality of diaphragms 50.

The controller 70 may control the diameters of the openings 51 of the plurality of diaphragms 50 by the following method. In a second example of the first operation, the controller 70 controls the diameter of the opening 51 in each of the plurality of diaphragms 50 so that two adjacent images among the plurality of images overlap. After the two adjacent images among the plurality of images overlap, the controller 70 controls the diameter of the opening 51 in each of the plurality of diaphragms 50 so that the openings 51 in all of the plurality of diaphragms 50 gradually close until the two adjacent images among the plurality of images border each other.

In the second example of the first operation, once the openings 51 of the plurality of diaphragms 50 are maximized, the controller 70 may gradually close the openings 51 of the plurality of diaphragms 50. By gradually closing the openings 51 of the plurality of diaphragms 50, the plurality of images gradually become smaller, and the crosstalk gradually becomes smaller. As shown in FIG. 5 and FIG. 6, the controller 70 closes the openings 51 of the plurality of diaphragms 50 until the crosstalk disappears on the straight line L3 passing through the center C1 and the center C2 of the two adjacent images. When the two adjacent images among the plurality of images border each other, the controller 70 fixes the diameter of the opening 51 in each of the plurality of diaphragms 50.

By the first operation, the control becomes easy, and the control time is reduced.

(Second Operation)

The second operation by the controller 70 will be described. In the second operation, the plurality of lenses 40 are disposed so that two adjacent lenses 40 included in the plurality of lenses 40 border each other. The controller 70 controls at least one of the diameter of the opening 51 in each of the plurality of diaphragms 50 and the position of each of the plurality of diaphragms 50 in the optical axis direction Dr1 of the imaging element 30 so that the size of the plurality of images is the same as that of the plurality of lenses 40.

There are cases in which the disposition of the plurality of images with high efficiency may be determined according to the disposition of the plurality of lenses 40. For example, in a case in which the plurality of lenses 40, the diameters of which are the same, border each other, when the diameters of the plurality of lenses 40 are the same as the diameters of the plurality of images, the plurality of images border each other. At this time, the size of the valid area is equal to the first reference value. For example, when the image formation magnification changes, the controller 70 may perform the above-described control while changing the image formation magnification. Therefore, the control becomes easy, and the control time is reduced.

(Third Operation)

The third operation by the controller 70 will be described. In the third operation, the controller 70 controls at least one of the diameter of the opening 51 in each of the plurality of diaphragms 50 and the position of each of the plurality of diaphragms 50 in the optical axis direction Dr1 of the imaging element 30 so that the size of the valid area of the plurality of images is equal to or greater than the first reference value and is equal to or less than the second reference value. The second reference value is the maximum value of the size of the valid area.

In the third operation, the controller 70 performs the above described control so that the size of the valid area of the entire image is equal to or greater than the first reference value and is equal to or less than the second reference value. The second reference value is different from the first reference value. In a case in which the sizes of the lenses 40 are not uniform, the first reference value and the second reference value of the valid area corresponding to each of the lenses 40 may be set according to the size of the lens 40.

A specific example of the third operation will be described. The controller 70 calculates the size of the valid area corresponding to each of the plurality of diameters of the openings 51 of the diaphragms 50 on the basis of Expression (3). Alternatively, the controller 70 calculates the size of the valid area corresponding to each of the plurality of positions of the diaphragms 50 in the optical axis direction Dr1 of the imaging element 30 on the basis of Expression (3). Therefore, the plurality of sizes of the valid area according to the diameters of the openings 51 of the diaphragms 50 or the positions of the diaphragms 50 are calculated. The controller 70 recognizes the maximum value of the calculated sizes of the valid area as the second reference value. In addition, the controller 70 calculates the size of the valid area when two adjacent images border each other, that is, the first reference value, by a geometry calculation based on Expression (3). Then, the controller 70 controls at least one of the diameter of the opening 51 in each of the plurality of diaphragms 50 and the position of each of the plurality of diaphragms 50 so that the size of the valid area is equal to or greater than the first reference value and is equal to or less than the second reference value.

The controller 70 may calculate the size of the valid area on the basis of the image signal while changing at least one of the diameter of the opening 51 in each of the plurality of diaphragms 50 and the position of each of the plurality of diaphragms 50. Therefore, the controller 70 calculates the plurality of sizes of the valid area. The controller 70 recognizes the maximum value of the calculated sizes of the valid area as the second reference value. In addition, the controller 70 recognizes the size of the valid area when two adjacent images border each other as the first reference value. Then, the controller 70 controls at least one of the diameter of the opening 51 in each of the plurality of diaphragms 50 and the position of each of the plurality of diaphragms 50 so that the size of the valid area is equal to or greater than the first reference value and is equal to or less than the second reference value.

Figure 7:
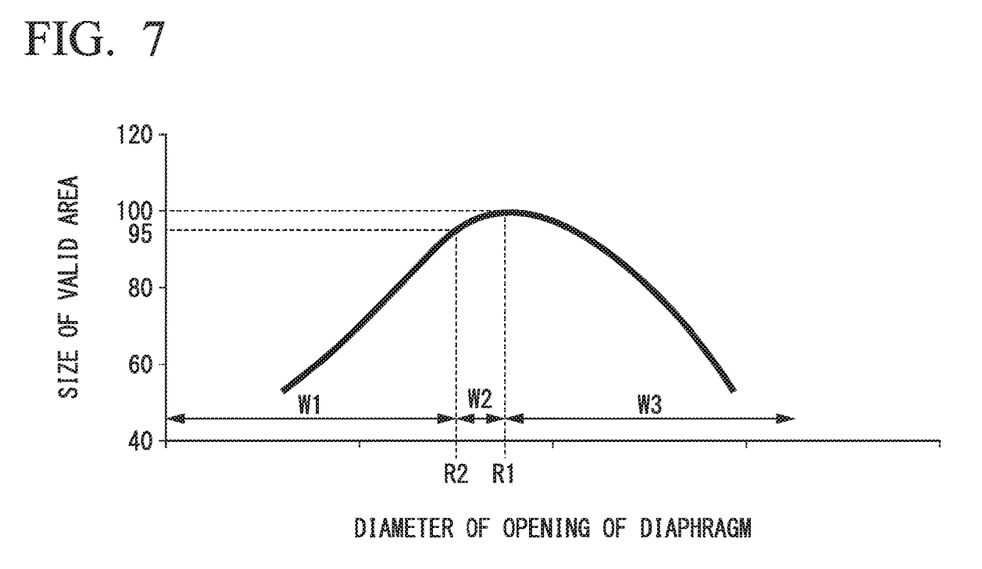
FIG. 7 is a graph showing a valid area in the embodiment of the present invention.

FIG. 7 shows the size of the valid area of one image in a case in which the diameters of all of the plurality of images are the same. The horizontal direction in the graph shown in FIG. 7 indicates the diameter of the opening 51 of the diaphragm 50. The diameter of the opening 51 of the diaphragm 50 increases toward the right in the graph shown in FIG. 7. The vertical direction in the graph shown in FIG. 7 indicates the size of the valid area. The size of the valid area increases upward in the graph shown in FIG. 7. The size of the valid area is shown as the ratio (%) with respect to the maximum value thereof.

When the diameter of the opening 51 of the diaphragm 50 is R1, the size of the valid area is the maximum (100%). When the diameter of the opening 51 of the diaphragm 50 is R2, two adjacent images border each other. In a range W1 in which the diameter of the opening 51 of the diaphragm 50 is equal to or less than R2, the size of the valid area rapidly increases while the diameter of the opening 51 of the diaphragm 50 increases. At this time, the size of the valid area is approximately 95% of the maximum value thereof. In a range W2 in which the diameter of the opening 51 of the diaphragm 50 is equal to or greater than R2 and is equal to or less than R1, crosstalk occurs. In the range W2, the amount of increase of the size of the opening 51 of the diaphragm 50 is greater than that of the crosstalk. Therefore, in the range W2, the size of the valid area gradually increases while the diameter of the opening 51 of the diaphragm 50 increases. In a case in which the diameter of the opening 51 of the diaphragm 50 is equal to or greater than R2, the amount of change of the size of the valid area is less than that of the diameter of the opening 51 of the diaphragm 50 due to the crosstalk. In a range W3 in which the diameter of the opening 51 of the diaphragm 50 is equal to or greater than R1, the amount of increase of the crosstalk is greater than that of the size of the opening 51 of the diaphragm 50. Therefore, in the range W3, the size of the valid area is reduced while the diameter of the opening 51 of the diaphragm 50 increases.

In the range W1, since the images do not border each other, the gap is large. In addition, as shown in FIG. 7, in the range WI, the size of the valid area is small. In the range W3, the gap is small or absent. However, in the range W3, the size of the valid area is reduced while the diameter of the opening 51 of the diaphragm 50 increases. Therefore, in the third operation, the controller 70 performs the control in the range W2.

The controller 70 may control at least one of the diameter of the opening 51 in each of the plurality of diaphragms 50 and the position of each of the plurality of diaphragms 50 in the optical axis direction Dr1 of the imaging element 30 so that the size of the valid area of the plurality of images is equal to the second reference value. That is, the controller 70 may perform the control so that the size of the valid area of the plurality of images is the maximum.

The controller 70 may control at least one of the diameter of the opening 51 in each of the plurality of diaphragms 50 and the position of each of the plurality of diaphragms 50 in the optical axis direction Dr1 of the imaging element 30 so that the size of the valid area of the plurality of images is equal to or greater than the first reference value and is less than a third reference value. The gap occurs only when the size of the valid area is less than the third reference value.

In the third operation, due to the control of the size of the valid area to be equal to or greater than the first reference value and equal to or less than the second reference value, the control range of the diameters of the openings 51 of the plurality of diaphragms 50 or the control range of the positions of the plurality of diaphragms 50 in the optical axis direction Dr1 of the imaging element 30 is limited. Therefore, the control becomes easy, and the control time is reduced.

(Fourth Operation)

The fourth operation by the controller 70 will be described. In the fourth operation, in a case in which the position of at least one of the plurality of lenses 40, the plurality of diaphragms 50, and the imaging element 30 changes in the optical axis direction of the imaging element 30 after the size of the valid area reaches a predetermined size, the controller 70 controls at least one of the diameter of the opening 51 in each of the plurality of diaphragms 50 and the position of each of the plurality of diaphragms 50 in the optical axis direction Dr1 of the imaging element 30 so that the size of the valid area is fixed to the predetermined size. The predetermined size is equal to or greater than the first reference value.

There are cases in which, the image formation magnification changes after the size of the valid area reaches the predetermined size through the first to third operations. In a case in which the image formation magnification changes, the controller 70 controls at least one of the diameter of the opening 51 in each of the plurality of diaphragms 50 and the position of each of the plurality of diaphragms 50 so that the size of the valid area is not changed according to the change of the image formation magnification.

By the fourth operation, the control becomes easy, and the control time is reduced.

As described above, the controller 70 of the embodiment of the present invention controls at least one of the diameter of the opening 51 in each of the plurality of diaphragms 50 and the position of each of the plurality of diaphragms 50 in the optical axis direction Dr1 of the imaging element 30 so that the size of the valid area of the plurality of images projected on the imaging element 30 by the plurality of lenses 40 is equal to or greater than the first reference value. Therefore, the imaging device 10 is able to reduce the crosstalk and the gap in the image projected by the lens 40.

In a case in which the control is performed so that the size of the valid area of the plurality of images is equal to the first reference value, the control becomes easy, and the control time is reduced.

In a case in which the plurality of lenses 40 are disposed so that two adjacent lenses 40 border each other, the control is performed so that the size of the plurality of images is the same as that of the plurality of lenses 40. Therefore, the control becomes easy, and the control time is reduced.

In a case in which the control is performed so that the size of the valid area of the plurality of images is equal to greater than the first reference value and is equal to or less than the second reference value, the control becomes easy, and the control time is reduced.

In a case in which the control is performed so that the size of the valid area is fixed to a predetermined size, the control becomes easy, and the control time is reduced.

While preferred embodiments of the invention have been described and shown above, it should be understood that these are examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. An imaging device, comprising:
a stage configured to hold a sample which is a subject;
an imaging element configured to image the sample;
a plurality of lenses disposed between the stage and the imaging element and configured to project an image of the sample on the imaging element;
a plurality of diaphragms disposed between the plurality of lenses and the imaging element and have openings;
an adjuster configured to adjust a position of the stage in an optical axis direction of the imaging element and adjust a position of at least one of the imaging element and the plurality of lenses in the optical axis direction of the imaging element; and
a controller,
wherein light passing through each of the plurality of lenses passes through any one of the plurality of diaphragms,
the controller is configured to control at least one of a diameter of the opening in each of the plurality of diaphragms and a position of each of the plurality of diaphragms in the optical axis direction of the imaging element so that a size of a valid area of a plurality of images projected on the imaging element by the plurality of lenses is equal to or greater than a first reference value,
the valid area is an area on which each of the plurality of images is projected, excluding an area in which two adjacent images overlap, and
the first reference value is the size of the valid area when the two adjacent images border each other.

2. The imaging device according to claim 1, wherein the controller is configured to control at least one of the diameter of the opening in each of the plurality of diaphragms and the position of each of the plurality of diaphragms in the optical axis direction of the imaging element so that the size of the valid area of the plurality of images is equal to the first reference value.

3. The imaging device according to claim 1, wherein the plurality of lenses are disposed so that two adjacent lenses included in the plurality of lenses border each other, and
the controller is configured to control at least one of the diameter of the opening in each of the plurality of diaphragms and the position of each of the plurality of diaphragms in the optical axis direction of the imaging element so that a size of the plurality of images is the same as a size of the plurality of lenses.

4. The imaging device according to claim 1, wherein the controller is configured to control at least one of the diameter of the opening in each of the plurality of diaphragms and the position of each of the plurality of diaphragms in the optical axis direction of the imaging element so that the size of the valid area of the plurality of images is equal to or greater than the first reference value and is equal to or less than a second reference value, and
the second reference value is a maximum value of the size of the valid area.

5. The imaging device according to claim 1, wherein the controller is configured to control the diameter of the opening in each of the plurality of diaphragms so that the openings in all of the plurality of diaphragms close, and
after the openings in all of the plurality of diaphragms close, the controller is configured to control the diameter of the opening in each of the plurality of diaphragms so that the openings in all of the plurality of diaphragms gradually open until the two adjacent images border each other.

6. The imaging device according to claim 1, wherein the controller is configured to control the diameter of the opening in each of the plurality of diaphragms so that the two adjacent images overlap, and
after the two adjacent images overlap, the controller is configured to control the diameter of the opening in each of the plurality of diaphragms so that the openings in all of the plurality of diaphragms gradually close until the two adjacent images border each other.

7. The imaging device according to claim 1, wherein the controller is configured to calculate the size of the valid area on the basis of the positions of the plurality of lenses, the plurality of diaphragms, and the imaging element in the optical axis direction of the imaging element, and
the controller is configured to control at least one of the diameter of the opening in each of the plurality of diaphragms and the position of each of the plurality of diaphragms in the optical axis direction of the imaging element on the basis of the calculated size of the valid area.

8. The imaging device according to claim 1, wherein, in a case in which the position of at least one of the plurality of lenses, the plurality of diaphragms, and the imaging element in the optical axis direction of the imaging element changes after the size of the valid area reaches a predetermined size, the controller is configured to control at least one of the diameter of the opening in each of the plurality of diaphragms and the position of each of the plurality of diaphragms in the optical axis direction of the imaging element so that the size of the valid area is fixed to the predetermined size, and the predetermined size is equal to or greater than the first reference value.

* * * * *